(12) United States Patent
Kouchi et al.

(10) Patent No.: US 8,587,262 B2
(45) Date of Patent: Nov. 19, 2013

(54) ASSEMBLED BATTERY MONITORING APPARATUS, METHOD FOR DETECTING WIRING DISCONNECTION OF ASSEMBLED BATTERY, AND ASSEMBLED BATTERY SYSTEM

(75) Inventors: Katsuya Kouchi, Kyoto (JP); Yoshihiko Mizuta, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 745 days.

(21) Appl. No.: 12/455,011

(22) Filed: May 27, 2009

(65) Prior Publication Data
US 2009/0295396 A1   Dec. 3, 2009

(30) Foreign Application Priority Data

May 28, 2008 (JP) ................. P2008-140197

(51) Int. Cl.
*H02J 7/04* (2006.01)
(52) U.S. Cl.
USPC ............................................ 320/165; 320/116
(58) Field of Classification Search
USPC ......................................... 320/116–122, 165
See application file for complete search history.

(56) References Cited

U.S. PATENT DOCUMENTS 6,255,826 B1 * 7/2001 Ohsawa et al. ............... 320/116
7,126,342 B2 * 10/2006 Iwabuchi et al. ............. 320/121

FOREIGN PATENT DOCUMENTS

| JP | 2001-056350 | 2/2001 |
| JP | 2002-204537 | 7/2002 |
| JP | 2005-168118 A | 6/2005 |

* cited by examiner

*Primary Examiner* — Drew A Dunn
*Assistant Examiner* — Robert Grant
(74) *Attorney, Agent, or Firm* — Carrier Blackman & Associates, P.C.; William D. Blackman; Joseph P. Carrier

(57) ABSTRACT

An assembled battery monitoring device that detects presence of disconnection in wiring pulled from an assembled battery in which a plurality of electric cells are connected in series. The electric cells are connected respectively in parallel to auxiliary current channels each having a setting resistance value, and the presence of the disconnection in the wiring is detected based on a detection voltage when the switching device for auxiliary current channel is turned to the closed state.

13 Claims, 5 Drawing Sheets

ASSEMBLED BATTERY MONITORING APPARATUS, METHOD FOR DETECTING WIRING DISCONNECTION OF ASSEMBLED BATTERY, AND ASSEMBLED BATTERY SYSTEM

BACKGROUND OF THE INVENTION

1. Field of Invention

The present invention relates to an assembled battery monitoring device for an assembled battery in which a plurality of electric cells are connected in series that includes: a voltage measuring unit that detects a voltage of each electric cell by carrying out a setting operation for voltage measurement through wiring pulled from a positive terminal of each electric cell and a negative terminal of an electric cell on a lowest potential side; and a disconnection detecting unit that detects presence of disconnection in the wiring based on a detection voltage obtained by the setting operation for voltage measurement, as well as to a method of detecting disconnection in wiring for an assembled battery, and an assembled battery system.

2. Description of Related Art

Such an assembled battery monitoring device is a device for separately detecting a voltage of each of the electric cells that constitute the assembled battery.

As a technique of detecting a voltage of each electric cell, in addition to a technique, for example, of simply measuring a voltage of wiring between a positive terminal and a negative terminal of each electric cell (such as a technique using a difference amplifier or a resistance voltage dividing method), a technique of connecting a capacitor in parallel with each electric cell (see FIG. 5), and charging the capacitor once with the voltage of the electric cell, and then measuring the voltage of the charged capacitor, as described in JP-A-2001-56350 and JP-A-2002-204537, has been conceived of Incidentally, with the technique of measuring the voltage of the electric cell by means of the capacitor, it is possible to measure a value of the voltage of each electric cell in the same time.

When detecting the voltage of each electric cell as described above, disconnection of the wiring pulled from the assembled battery for voltage detection poses a problem. It should be noted that the disconnection as used herein indicates situations in which the wiring is electrically disconnected, including a case in which the wiring is actually cut as well as a case in which the wiring is electrically disconnected due to poor fitting of a socket that connects the wiring.

When such disconnection occurs in the wiring for voltage detection of the electric cells, for example, in the technique of charging the capacitor once with each of the electric cells, as the capacitors are connected in series, even when disconnection occurs in the wiring at a position indicated by "x" in FIG. 5, for example, capacitors Ca, Cb that are in serial connection are charged through adjacent electric cells Va, Vb that sandwich the disconnected portion, and thus voltages of the capacitors Ca, Cb that do not correctly represent the voltages of the electric cells Va, Vb, respectively, are detected.

In order to avoid such an erroneous detection, JP-A-2002-204537 employs a technique in which capacities of capacitors that are connected in series are changed accordingly from each other so that, when disconnection as described above occurs, a charging voltage of each capacitor varies between a case in which the wiring is normally connected and a case in which disconnection has occurred, and the occurrence of the disconnection can be detected based on a voltage difference. However, the technique of detecting the disconnection according to JP-A-2002-204537, the voltage difference between the detection voltage in the normal case and the detection voltage when the disconnection occurs is not sufficient, and therefore an improvement has been desired.

Additionally, while the above describes the problem when disconnection occurs taking an example in which the voltage of each electric cell is detected by means of the capacitor, a similar problem also occurs due to wiring disconnection when, for example, the voltage of each electric cell is directly measured using the voltage measuring unit.

Specifically, assuming that the capacitor as described above is replaced with an input impedance between detection voltage input terminals of the voltage measuring unit, there is a case that a voltage divided by the input impedance is detected. Further, the same problem also occurs when a capacitor for noise absorption is connected to the wiring from each of the electric cells to the voltage measuring unit.

SUMMARY OF THE INVENTION

The present invention is made in view of the above circumstances, and the present invention aims to detect wiring disconnection adequately when disconnection occurs in wiring for detecting a voltage of each electric cell.

In a first aspect of the present invention, an assembled battery monitoring device for an assembled battery in which a plurality of electric cells are connected in series includes: a voltage measuring unit that detects a voltage of each electric cell by carrying out a setting operation for voltage measurement through wiring pulled from a positive terminal of each electric cell and a negative terminal of an electric cell on a lowest potential side; and a disconnection detecting unit that detects presence of disconnection in the wiring based on a detection voltage obtained by the setting operation for voltage measurement, wherein the electric cells are connected respectively in parallel to auxiliary current channels each having a setting resistance value, each of the auxiliary current channels is provided with a switching device for auxiliary current channel that turns on and off electricity through the corresponding auxiliary current channel, and the disconnection detecting unit is configured to carry out a switching operation of the switching devices for auxiliary current channel so as to prevent the switching devices that are adjacent in a potential order from being turned to the closed state at the same time, and to detect the presence of the disconnection in the wiring based on at least a detection voltage when the switching device for auxiliary current channel is turned to the closed state out of detection voltages obtained by the setting operation for voltage measurement.

Specifically, if there is no disconnection at any portion of the wiring connecting the assembled battery and the voltage measuring unit, the switching device for auxiliary current channel that is connected in parallel with each electric cell is turned either to the closed state or to the open state, the voltage for the wiring basically does not change, and the voltage of each electric cell is to be applied by the voltage measuring unit.

On the other hand, when the wiring disconnection occurs, by turning on electricity to the auxiliary current channel with the switching device for auxiliary current channel turned to the closed state, the voltage value to be detected by the voltage measuring unit becomes sufficiently low.

To explain by a further specific example, with the technique of measuring the voltage of the electric cell by means of the capacitor, as shown schematically in FIG. 6(a), when the wiring disconnection occurs at a symbol "x" in FIG. 6(a), the setting operation for voltage measurement is carried out with a switch for auxiliary current channel Sa corresponding to an electric cell Va is turned to the closed state.

The setting operation for voltage measurement here is to measure the voltages of the capacitors Ca, Cb after the switches Pa, Pb, Pc are turned to the closed state and the capacitors Ca, Cb are charged by the electric cells Va, Vb.

At this time, since the switch Sa is turned to the closed state, the capacitor Cb is charged by the electric cells Va, Vb, but the capacitor Ca is not charged (strictly speaking, the capacitor Ca is charged instantaneously but then moves to a stationary state in which the capacitor is not charged).

In contrast, when the same setting operation for voltage measurement is carried out with the switch for auxiliary current channel Sb corresponding to the electric cell Vb turned to the closed state, the capacitor Ca is charged by the electric cells Va, Vb, but the capacitor Cb is not charged (strictly speaking, the capacitor Cb is charged instantaneously but then moves to the stationary state in which the capacitor is not charged).

In this manner, when the wiring disconnection occurs, there is a large difference between the measured voltages depending on whether the voltage measurement is carried out with the switching device for auxiliary current channel is turned to the closed state or to the open state.

Moreover, in a case in which the voltage of each electric cell is measured directly by the voltage measuring unit, as shown schematically in FIG. 6(b), when the wiring disconnection occurs at a symbol "x" in FIG. 6(b), the setting operation for voltage measurement is carried out with the switch for auxiliary current channel Sa corresponding to the electric cell Va is turned to the closed state.

The setting operation for voltage measurement here is to measure the voltages of the electric cells Va, Vb after simply turning the switches Pa, Pb, Pc to the closed state.

At this time, since the switch Sa is turned to the closed state and an input impedance of the voltage measuring unit (indicated by Ri in FIG. 6(b)) is very high, a voltage that is a total of the voltages of the electric cells Va, Vb is applied to an input terminal for detecting the voltage of the electric cell Vb, and only a very small voltage is applied to an input terminal for detecting the voltage of the electric cell Va.

In contrast, when the same setting operation for voltage measurement is carried out with the switch for auxiliary current channel Sb corresponding to the electric cell Vb turned to the closed state, a voltage that is a total of the voltages of the electric cells Va, Vb is applied to an input terminal for detecting the voltage of the electric cell Va, and only a very small voltage is applied to an input terminal for detecting the voltage of the electric cell Vb.

In this manner, when the wiring disconnection occurs, there is a large difference between the measured voltages depending on whether the voltage measurement is carried out with the switching device for auxiliary current channel is turned to the closed state or to the open state.

Although, as described above, by making the result of the voltage measurement of the electric cell connecting to the portion at which the wiring disconnection has occurred to a considerably small voltage value, it is possible to detect the occurrence of the wiring disconnection based on the fact itself that the voltage value is small, it is often not possible to stably determine the presence of the wiring disconnection depending on relation between the actual measured voltage and a determination value and such. In such a case, taking advantage of the fact that the voltage value becomes high when the voltage detection is carried out with the switching device for auxiliary current channel turned to the open state, by obtaining the difference between the detection voltage value when the switching device for auxiliary current channel is turned to the open state and the detection voltage value when the switching device for auxiliary current channel is turned to the closed state and determining the presence of the wiring disconnection based on the difference, it is possible to carry out the determination of the presence of the wiring disconnection with higher accuracy.

Further, as the presence of the wiring disconnection is determined based on the voltage value obtained by the measurement operation of the voltage for each electric cell, it is possible to specify the position of the wiring disconnection is in the wiring of the measured electric cell, and in particular, when the measurement result of the voltage measurement operation for two electric cells adjacent in series is obtained, and all of the measurement results indicate the occurrence of the wiring disconnection, it is possible to estimate that the disconnection occurs in the wiring from a connecting potion between the two electric cells.

Further, in a second aspect of the present invention, in addition to the configuration according to the first aspect, the electric cells are connected respectively in parallel to capacitors in the wiring from the electric cells to the voltage measuring unit, a switching device for positive terminal wiring that turns on and off electricity of the wiring is provided between the wiring between a positive terminal side of each of the electric cells and the capacitor corresponding to the electric cell, the voltage measuring unit is configured to measure a voltage of each of the capacitors as the setting operation for voltage measurement by, after turning the switching device for positive terminal wiring in an open state to a closed state and charging each capacitor, turning the switching device for positive terminal wiring to the open state, and the disconnection detecting unit is configured to cause the voltage measuring unit to carry out the setting operation for voltage measurement in a first switching setting state in which one of even-numbered and odd-numbered ones of the switching devices for auxiliary current channel in the potential order are turned to the closed state at the same time and the other ones to the open state at the same time, subsequently cause the voltage measuring unit to carry out the setting operation for voltage measurement in a second switching setting state in which each of the switching devices for auxiliary current channel is operated to be switched to a state opposite from the state in the first switching setting state, and to detect the presence of the wiring disconnection based on a detection voltage in the first switching setting state and a detection voltage in the second switching setting state.

Specifically, the configuration is for detecting the presence of the disconnection in the wiring when the voltage of the electric cell is measured by the means of the capacitor.

As a specific operation of detecting the wiring disconnection, first, the switching device for auxiliary current channel provided for each auxiliary current channel is set to the first switching setting state.

As each auxiliary current channel is connected in parallel with the electric cell, the auxiliary current channels are connected in series with respect to each other. The switching devices for auxiliary current channel that are provided for the even-numbered or the odd-numbered auxiliary current channels in the potential order of the auxiliary current channels are turned to the closed state at the same time, and the remaining switching devices for auxiliary current channel are turned to the open state at the same time.

As the switching operation of the second switching setting state is the state that is opposite from that of the first switching setting state, the switching devices for auxiliary current channel to be turned to the closed state are alternated between the even-numbered ones and the odd-numbered ones in the order respectively in the first switching setting state and the second switching setting state, and either of the even-numbered ones and the odd-numbered ones can be turned to the closed state first.

In the first switching setting state, from each electric cell, the capacitor that is connected in parallel with the electric cell is charged with the switching device for positive terminal wiring turned to the closed state.

At this time, when there is no wiring disconnection in the wiring from each electric cell to the voltage measuring unit, the capacitor is charged almost in the same manner if the switching device for auxiliary current channel is in the closed state or in the open state.

In contrast, when the disconnection occurs in the wiring, the capacitor that corresponds to the electric cell in which the wiring having the wiring disconnection is on the positive terminal side or the negative terminal side of the electric cell is not charged, and the current from the electric cell flows to the auxiliary current channel whose switching device for auxiliary channel is turned to the closed state.

After the charging operation of the capacitors, the voltage of each capacitor is detected by the voltage measuring unit with the switching device for positive terminal wiring turned to the open state.

Moreover, switching to the second switching setting state, the setting operation for voltage measurement as described above is repeated.

With this, the voltage detection result when the corresponding switching device for auxiliary current channel is in the closed state and the voltage detection result when in the open state can be obtained for each electric cell, and, when the wiring disconnection occurs, as described above, the detection voltage when the switching device for auxiliary current channel is turned to the closed state becomes extremely low for the capacitor that is connected to the wiring in which the wiring disconnection occurs.

Therefore, when the wiring disconnection occurs, a large variation in the detection voltage can be seen.

Further, in the third aspect of the present invention, in addition to the configuration according to the second aspect, the disconnection detecting unit is configured to obtain, for each electric cell, a difference between the detection voltage in the first switching setting state and the detection voltage in the second switching setting state, and detect the presence of the wiring disconnection based on the difference.

Focusing on a single electric cell, the detection voltage in the first switching setting state and the detection voltage in the second switching setting state are the detection voltage when the switching device for auxiliary current channel is turned to the open state and the detection voltage when switching device for auxiliary current channel is turned to the closed state, and the difference between the detection voltages is obtained.

As described above, when there is no wiring disconnection in the wiring, there is no difference in the detection voltages, and when the disconnection occurs in the wiring, the voltage value becomes high when the voltage detection is carried out with the switching device for auxiliary current channel turned to the open state, and therefore the difference between the detection voltage value when the switching device for auxiliary current channel is turned to the open state and the detection voltage value when the switching device for auxiliary current channel is turned to the closed state becomes large, and by determining the presence of the wiring disconnection based on the difference, it is possible to carry out the determination of the presence of the wiring disconnection with higher accuracy.

Further, in the fourth aspect of the present invention, a method of detecting disconnection in wiring for an assembled battery in which a plurality of electric cells are connected in series includes: detecting a voltage of each electric cell by carrying out a setting operation for voltage measurement through wiring pulled from a positive terminal of each electric cell and a negative terminal of an electric cell on a lowest potential side; and detecting disconnection in the wiring based on a detection voltage obtained by the setting operation for voltage measurement, wherein the electric cells are connected respectively in parallel to auxiliary current channels each having a setting resistance value, each of the auxiliary current channels is provided with a switching device for auxiliary current channel that turns on and off electricity through the corresponding auxiliary current channel, and the method includes: carrying out a switching operation of the switching devices for auxiliary current channel so as to prevent the switching devices that are adjacent in a potential order from being turned to the closed state at the same time, and detecting the presence of the disconnection in the wiring based on at least a detection voltage when the switching device for auxiliary current channel is turned to the closed state out of detection voltages obtained by the setting operation for voltage measurement.

Specifically, as described for the first aspect, when the wiring disconnection occurs, there is a large difference between the measured voltages depending on whether the voltage measurement is carried out with the switching device for auxiliary current channel turned to the closed state or to the open state, thereby the presence of the wiring disconnection can be detected.

Further, in the fifth aspect of the present invention, in addition to the configuration of the fourth aspect, the electric cells are connected respectively in parallel to capacitors in the wiring pulled from the electric cells, a switching device for positive terminal wiring that turns on and off electricity of the wiring is provided between the wiring between a positive terminal side of each of the electric cells and the capacitor corresponding to the electric cell, and the method includes: measuring a voltage of each of the capacitors as the setting operation for voltage measurement by, after turning the switching device for positive terminal wiring in an open state to a closed state and charging each capacitor, turning the switching device for positive terminal wiring to the open state; and carrying out the setting operation for voltage measurement with the voltage measuring unit in which one of even-numbered and odd-numbered ones of the switching devices for auxiliary current channel in the potential order are turned to the closed state at the same time and the other ones to the open state at the same time, subsequently carrying out the setting operation for voltage measurement with the voltage measuring unit in a second switching setting state in which each of the switching devices for auxiliary current channel is operated to be switched to a state opposite from the state in the first switching setting state, and detecting the presence of the wiring disconnection based on a detection voltage in the first switching setting state and a detection voltage in the second switching setting state.

Specifically, the configuration is for detecting the presence of the disconnection in the wiring when the voltage of the electric cell is measured by the means of the capacitor.

As a specific operation of detecting the wiring disconnection, first, the switching device for auxiliary current channel provided for each auxiliary current channel is set to the first switching setting state.

As each auxiliary current channel is connected in parallel with the electric cell, the auxiliary current channels are connected in series with respect to each other. The switching devices for auxiliary current channel that are provided for the even-numbered or the odd-numbered auxiliary current channels in the potential order of the auxiliary current channels are turned to the closed state at the same time, and the remaining switching devices for auxiliary current channel are turned to the open state at the same time.

As the switching operation of the second switching setting state is the state that is opposite from that of the first switching setting state, the switching devices for auxiliary current channel to be turned to the closed state are alternated between the even-numbered ones and the odd-numbered ones in the order respectively in the first switching setting state and the second switching setting state, and either of the even-numbered ones and the odd-numbered ones can be turned to the closed state first.

In the first switching setting state, from each electric cell, the capacitor that is connected in parallel with the electric cell is charged with the switching device for positive terminal wiring turned to the closed state.

At this time, when there is no wiring disconnection in the wiring from each electric cell to the voltage measuring unit, the capacitor is charged almost in the same manner if the switching device for auxiliary current channel is in the closed state or in the open state.

In contrast, when the disconnection occurs in the wiring, the capacitor that corresponds to the electric cell in which the wiring having the wiring disconnection is on the positive terminal side or the negative terminal side of the electric cell is not charged, and the current from the electric cell flows to the auxiliary current channel whose switching device for auxiliary channel is turned to the closed state.

After the charging operation of the capacitors, the voltage of each capacitor is detected with the switching device for positive terminal wiring turned to the open state.

Moreover, switching to the second switching setting state, the setting operation for voltage measurement as described above is repeated.

With this, the voltage detection result when the corresponding switching device for auxiliary current channel is in the closed state and the voltage detection result when in the open state can be obtained for each electric cell, and, when the wiring disconnection occurs, as described above, the detection voltage when the switching device for auxiliary current channel is turned to the closed state becomes extremely low for the capacitor that is connected to the wiring in which the wiring disconnection occurs.

Therefore, when the wiring disconnection occurs, a large variation in the detection voltage can be seen.

Further, in the sixth aspect of the present invention, in addition to the configuration of the fifth aspect, the method includes obtaining, for each electric cell, a difference between the detection voltage in the first switching setting state and the detection voltage in the second switching setting state, and detect the presence of the wiring disconnection based on the difference.

Focusing on a single electric cell, the detection voltage in the first switching setting state and the detection voltage in the second switching setting state are the detection voltage when the switching device for auxiliary current channel is turned to the open state and the detection voltage when switching device for auxiliary current channel is turned to the closed state, and the difference between the detection voltages is obtained.

As described above, when there is no wiring disconnection in the wiring, there is no difference in the detection voltages, and when the disconnection occurs in the wiring, the voltage value becomes high when the voltage detection is carried out with the switching device for auxiliary current channel turned to the open state, and therefore the difference between the detection voltage value when the switching device for auxiliary current channel is turned to the open state and the detection voltage value when the switching device for auxiliary current channel is turned to the closed state becomes large, and by determining the presence of the wiring disconnection based on the difference, it is possible to carry out the determination of the presence of the wiring disconnection with higher accuracy.

Further, in a seventh aspect of the present invention, an assembled battery system includes: an assembled battery in which a plurality of electric cells are connected in series; wiring pulled from a positive terminal of each electric cell and a negative terminal of an electric cell on a lowest potential side; and the assembled battery monitoring device according to the first aspect that detects presence of disconnection in the wiring.

Therefore, in the assembled battery system, when the disconnection occurs in the wiring, there is a large difference between the measured voltages depending on whether the voltage measurement is carried out with the switching devices for auxiliary current channel are turned to the closed state or to the open state.

Further, in the eighth aspect of the present invention, an assembled battery system includes: an assembled battery in which a plurality of electric cells are connected in series; wiring pulled from a positive terminal of each electric cell and a negative terminal of an electric cell on a lowest potential side; and the assembled battery monitoring device according to the second aspect that detects presence of disconnection in the wiring.

Therefore, in the assembled battery system in which the voltages of the electric cells are measured by means of the capacitors, when the disconnection occurs in the wiring, there is a large difference between the measured voltages depending on whether the voltage measurement is carried out with the switching devices for auxiliary current channel are turned to the closed state or to the open state.

Further, in the ninth aspect of the present invention, an assembled battery system includes: an assembled battery in which a plurality of electric cells are connected in series; wiring pulled from a positive terminal of each electric cell and a negative terminal of an electric cell on a lowest potential side; and the assembled battery monitoring device according to the third aspect that detects presence of disconnection in the wiring.

Therefore, in the assembled battery system in which the voltages of the electric cells are measured by means of the capacitors, the difference between the detection voltage value when the switching device for auxiliary current channel is turned to the open state and the detection voltage value when the switching device for auxiliary current channel is turned to the closed state becomes large when the disconnection occurs in the wiring, and by determining the presence of the wiring disconnection based on the difference, it is possible to carry out the determination of the presence of the wiring disconnection with higher accuracy.

BRIEF DESCRIPTION OF THE DRAWINGS

The foregoing and other features of the invention will become apparent to one skilled in the art to which the present invention relates upon consideration of the invention with reference to the accompanying drawings, wherein.

DETAILED DESCRIPTION

The following describes an embodiment of an assembled battery monitoring device of the present invention based on the drawings.

Figure 1:
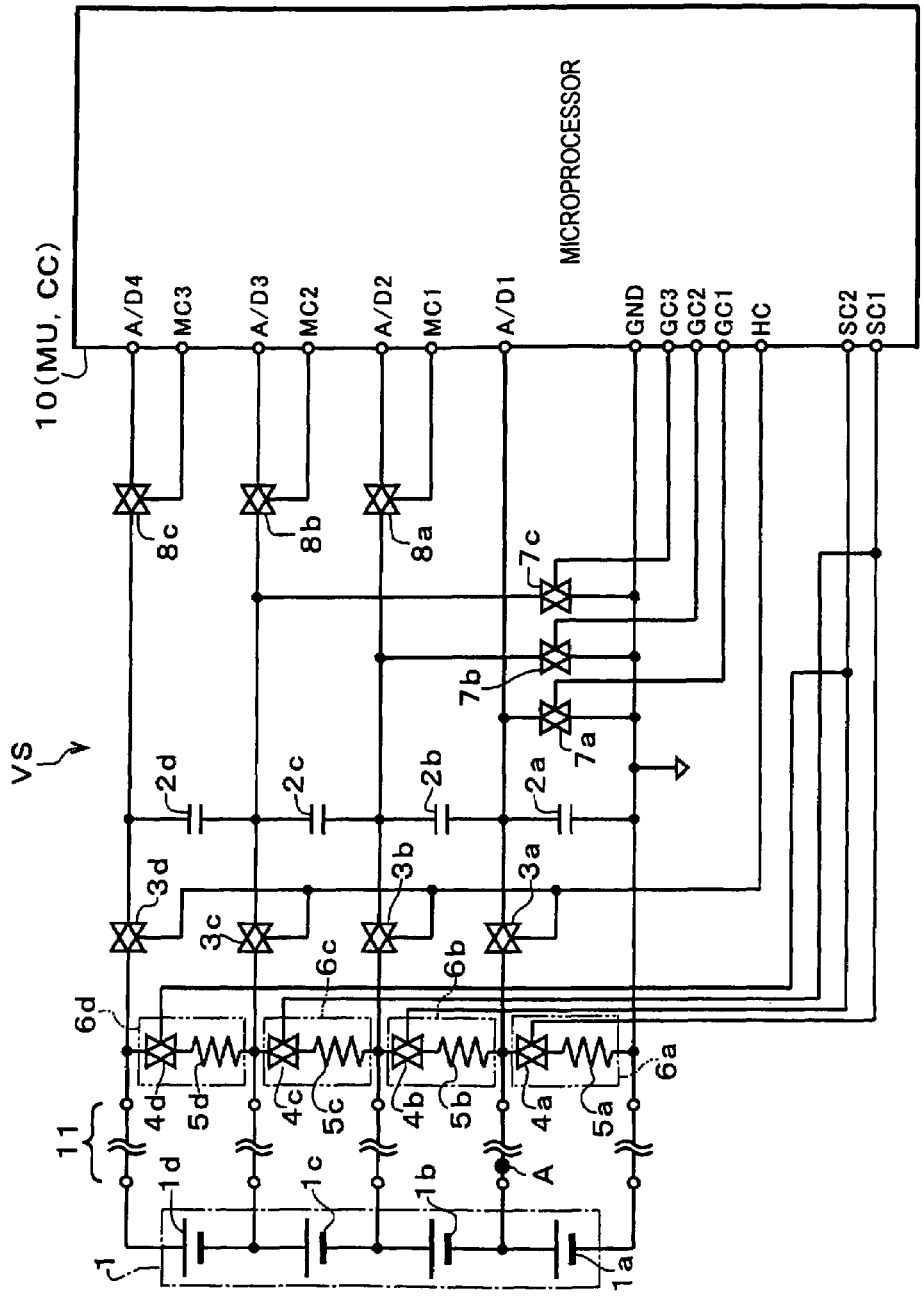
FIG. 1 is a circuit configuration diagram of an assembled battery monitoring device according to an embodiment of the present invention.

FIG. 1 shows a circuit configuration of an assembled battery system in which an assembled battery 1 and an assembled battery monitoring device VS are connected as a circuit.

Configuration of Assembled Battery 1

The assembled battery 1 is configured by connecting a plurality of electric cells 1a, 1b, 1c, 1d in series, and in this embodiment, for explanation's sake, a case in which the four electric cells 1a, 1b, 1c, 1d are connected in series is explained as an example. However, in practice, an assembled battery is configured by connecting a greater number of electric cells in series. The electric cells 1a, 1b, 1c, 1d are lithium-ion cells as one example of a secondary cell, but not limited to such a secondary cell, and the present invention can be applied to various types of assembled batteries.

Configuration of Assembled Battery Monitoring Device VS

The assembled battery monitoring device VS takes a form such that capacitors 2a, 2b, 2c, 2d are connected in parallel with the electric cells 1a, 1b, 1c, 1d, respectively, the capacitors 2a, 2b, 2c, 2d are respectively charged by cell voltage of the corresponding electric cells 1a, 1b, 1c, 1d, and voltages of the capacitors 2a, 2b, 2c, 2d that have been charged are sequentially detected.

In the middle of the wiring between positive terminals of the electric cells 1a, 1b, 1c, 1d and the capacitors 2a, 2b, 2c, 2d, respectively, a plurality of (four) switching devices for wiring positive terminals 3a, 3b, 3c, 3d that turn on and off electricity through the wiring and switch whether to charge the corresponding capacitors 2a, 2b, 2c, 2d or not respectively by the electric cells 1a, 1b, 1c, 1d are provided.

In order to serve this function, the switching devices for wiring positive terminals 3a, 3b, 3c, 3d are each provided on a side closer to the assembled battery 1 than the corresponding capacitors 2a, 2b, 2c, 2d (on a higher potential side viewing from each electric cell).

In this embodiment, the switching devices for wiring positive terminals 3a, 3b, 3c, 3d are configured as an analog switch, and this also applies to switching devices of various units that are described later, and a case in which such switching devices are configured as an analog switch is explained as an example.

Moreover, auxiliary current channels 6a, 6b, 6c, 6d configured by connecting switching devices 4a, 4b, 4c, 4d with resistances 5a, 5b, 5c, 5d in series are respectively connected in parallel with the electric cells 1a, 1b, 1c, 1d.

The auxiliary current channels 6a, 6b, 6c, 6d are originally circuit portions for balancing the voltages of the electric cells 1a, 1b, 1c, 1d by discharging the electric cell with high voltage when there is a variation between the electric cells 1a, 1b, 1c, 1d, but are also used for detecting whether or not disconnection has occurred in the wiring as described later.

The auxiliary current channels 6a, 6b, 6c, 6d are respectively connected in parallel with the electric cells 1a, 1b, 1c, 1d at positions closer to the assembled battery 1 than the switching devices for wiring positive terminals 3a, 3b, 3c, 3d.

It should be noted that the switching devices 4a, 4b, 4c, 4d that are respectively provided for the auxiliary current channels 6a, 6b, 6c, 6d and turn on and off electricity through the auxiliary current channels 6a, 6b, 6c, 6d are referred to the switching devices for auxiliary current channel 4a, 4b, 4c, 4d for explanation's sake.

The higher potential side of each of the capacitors 2a, 2b, 2c, 2d is connected to each of voltage measuring terminals of a voltage measuring unit MU configured by a microprocessor unit 10.

In FIG. 1, the voltage measuring terminal for measuring the voltage of the capacitor 2a is represented by "A/D1", the voltage measuring terminal for measuring the voltage of the capacitor 2b is represented by "A/D2", the voltage measuring terminal for measuring the voltage of the capacitor 2c is represented by "A/D3", and the voltage measuring terminal for measuring the voltage of the capacitor 2d is represented by "A/D4".

Moreover, a lower potential side (a side of a negative terminal) of the capacitor 2a on a lowest potential side in a potential order is connected to a ground terminal ("GND") of the microprocessor unit 10.

The voltage measuring terminals of the microprocessor unit 10 are input terminals of an incorporated A/D converter, and the microprocessor unit 10 detects a potential difference between each voltage measuring terminal and the "GND" terminal.

In the middle of the wiring from the higher potential side of each of the capacitors 2b, 2c, 2d (excluding the capacitor 2a) to the voltage measuring terminal of the microprocessor unit 10, switching devices for measuring operation 8a 8b, 8c are connected, and the voltage measuring terminals "A/D2", "A/D3", and "A/D4" are applied with a voltage only during a voltage measuring operation.

Further, in the middle of the wiring from the higher potential side of each of the capacitors 2a, 2b, 2c (excluding the capacitor 2d) to the voltage measuring terminal of the microprocessor unit 10, switching devices for ground connection 7a, 7b, 7c for connecting each wiring to the ground (the lowest potential side of the assembled battery 1) are connected.

The switching devices for ground connection 7a, 7b, 7c are provided in order to avoid application of an undesired high voltage to the voltage measuring terminals during voltage measurement, and will be described later in detail.

A circuit board of the assembled battery monitoring device VS having the above described circuit configuration is connected to the assembled battery 1 via a cable 11.

In other words, the voltage measuring unit MU detects the voltage of each of the electric cells 1a, 1b, 1c, 1d through the wiring (including the cable 11) pulled from the positive terminal of each of the electric cells 1a, 1b, 1c, 1d and the negative terminal of the electric cell 1a on the lowest potential side.

As a matter of fact, most wiring disconnection occurs within the cable 11, at a connecting connector between the cable 11 and the assembled battery 1, or at a connecting connector between the cable 11 and the circuit board of the assembled battery monitoring device VS.

Operation of Detecting Wiring Disconnection

Next, an operation of detecting the wiring disconnection is described.

Figure 3:
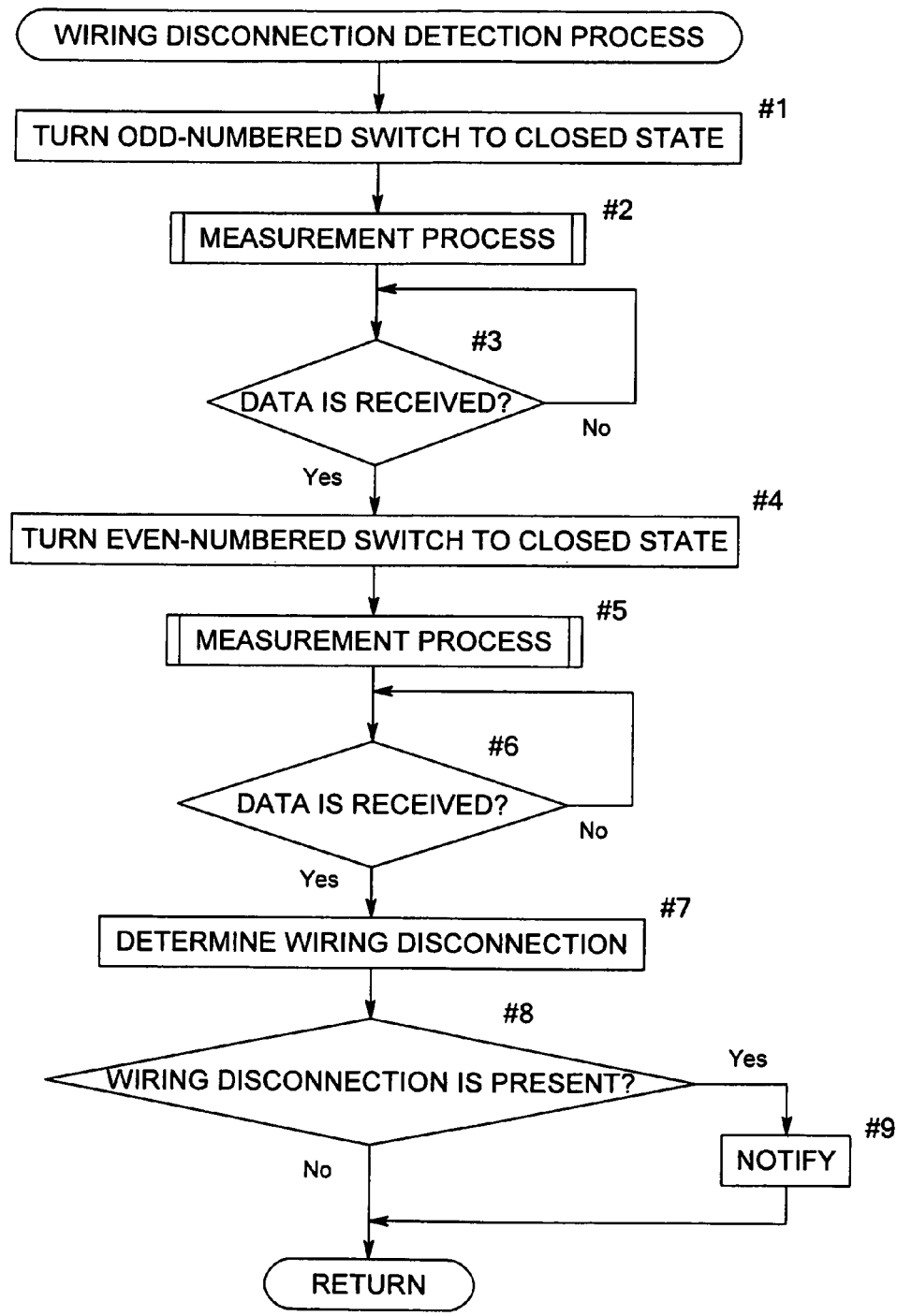
FIG. 3 is a flow chart according to the embodiment of the present invention.

The operation of detecting the wiring disconnection is carried out by the microprocessor unit 10 executing the process shown in a flow chart of FIG. 3, and the microprocessor unit 10 also functions as a disconnection detecting unit CC that detects the presence of the wiring disconnection.

Figure 2:
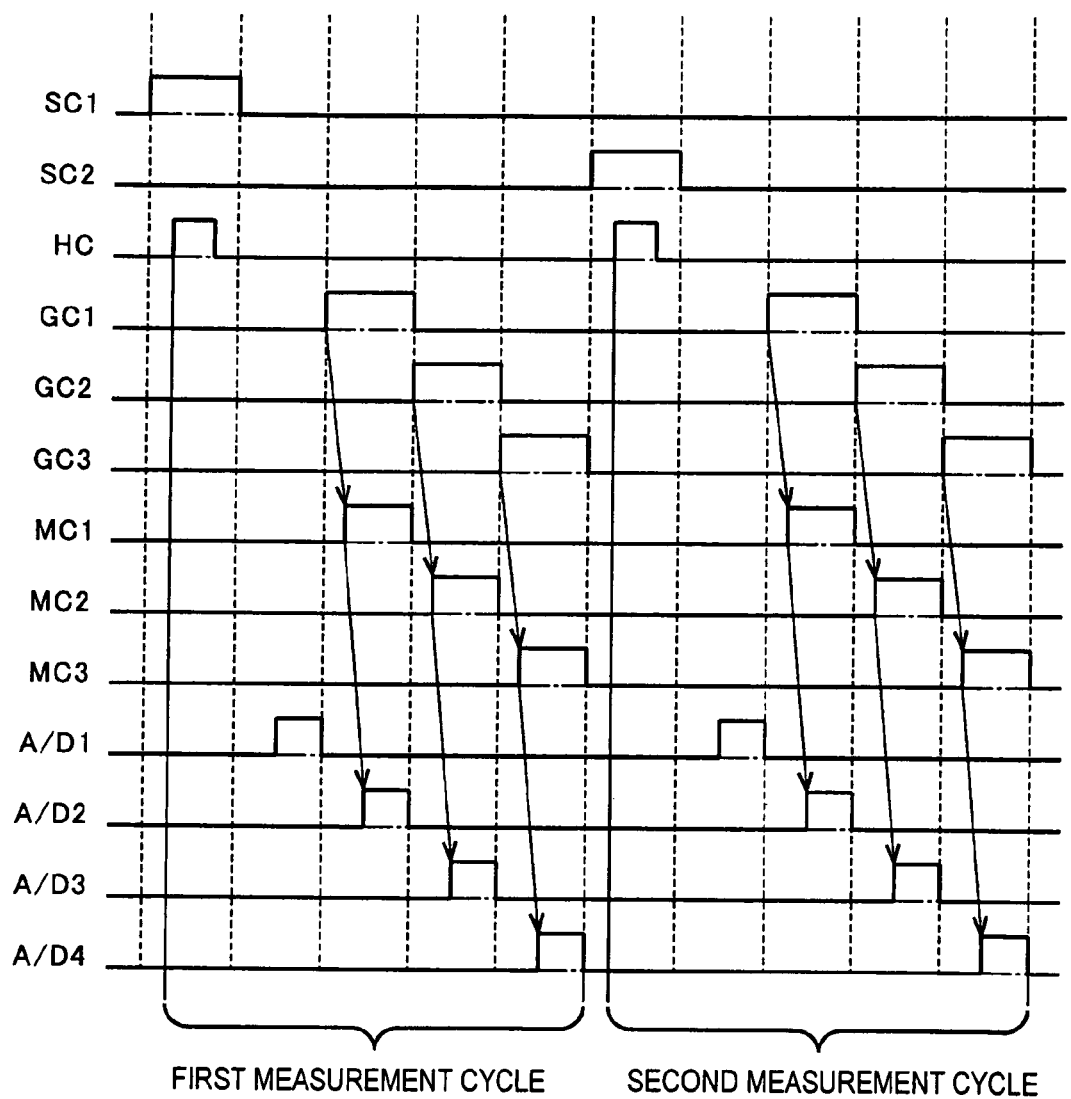
FIG. 2 is a time chart according to the embodiment of the present invention.

The following describes the operation based on the flow chart of FIG. 3 and a time chart of FIG. 2.

The microprocessor unit 10, first, turns the switching device for auxiliary current channels 4a, 4c provided for the odd-numbered (first and third) auxiliary current channel 6a, 6c from the lower potential side in the potential order to a closed state (ON state) for a time period that has been previously set, and maintains a open state (OFF state) for the switching device for auxiliary current channels 4b, 4d provided for the even-numbered (second and fourth) auxiliary current channels 6b, 6d from the lower potential side in the potential order.

As shown in FIG. 1, the odd-numbered switching device for auxiliary current channels 4a, 4c are operated to be switched at the same time based on an output signal "SC1" from a control signal output terminal of the microprocessor unit 10, and the even-numbered switching device for auxiliary current channel 4b, 4d are operated to be switched at the same time based on an output signal "SC2" from the control signal output terminal of the microprocessor unit 10.

The pulse signals "SC1" and "SC2" shown in FIG. 2 represent pulse signals outputted from the control signal output terminals of the corresponding reference numerals, and each of the switching devices 4a, 4b, 4c, 4d are turned to the closed state (ON state) at a H level side of the pulse signal, and each of the switching devices 4a, 4b, 4c, 4d are turned to the open state (OFF state) at a L level side of the pulse signal. This also applies to a pulse signal for controlling each switching device as described below.

Therefore, a pulse signal of the set time period is outputted at "SC1" in FIG. 2 for Step #1 in FIG. 3, and "SC2" maintained at L level during this period. For explanation's sake, the setting state of the switching devices for auxiliary current channel 4a, 4b, 4c, 4d is referred to as a first switching setting state.

In this manner, the odd-numbered switching devices for auxiliary current channel 4a, 4c and the even-numbered switching devices for auxiliary current channel 4b, 4d, in the potential order, are respectively operated to be switched at the same time, so as to be alternately opened and closed as described later, in order to prevent the adjacent switching devices in the potential order from being turned to the closed state at the same time.

Next, the microprocessor unit 10 that functions as the disconnection detecting unit CC instructs the voltage measuring unit MU to start a setting operation for measuring the voltage of each of the electric cells 1a, 1b, 1c, 1d (Step #2).

The function of the microprocessor unit 10 as the voltage measuring unit MU is implemented as a so-called subroutine, and the subroutine is called to carry out the process in Step #2.

Once the start of the setting operation for measuring the voltage is instructed, the voltage measuring unit MU carries out an operation of a range represented by a "first measurement cycle" in FIG. 2.

Specifically, a control signal output terminal represented by "HC" in FIG. 1 transmits a pulse signal represented by "HC" in FIG. 2.

The control signal "HC" is to control the switching operation of the switching devices for wiring positive terminals 3a, 3b, 3c, 3d at the same time, and the switching devices for wiring positive terminals 3a, 3b, 3c, 3d are simultaneously turned to the closed state based on this signal, thereby starting charging of the capacitors 2a, 2b, 2c, 2d from the respective electric cells 1a, 1b, 1c, 1d.

Subsequently, after the charging to the capacitors 2a, 2b, 2c, 2d is completed and the switching devices for wiring positive terminals 3a, 3b, 3c, 3d are turned to the open state, at timings indicated by the pulse signals represented by "A/D1" to "A/D4" in FIG. 2, voltages inputted to the respective voltage measuring terminal are A/D converted and read.

As can be seen from the pulse signals shown in FIG. 2, the voltage is detected sequentially from the capacitor 2a on the lower potential side in the potential order.

In parallel with the reading of the voltages, for each of the capacitors 2a, 2b, 2c (excluding the capacitor 2d on the highest potential side), at a timing at which the reading of the voltage is completed, the switching devices for ground connection 7a, 7b, 7c connected to the higher potential sides of the respective capacitors 2a, 2b, 2c are turned to the closed state, and the higher potential sides of the capacitors 2a, 2b, 2c for which the reading of the voltage is completed are grounded and discharged, and further, the switching devices for measuring operation 8a 8b, 8c provided for the wiring of the higher potential sides of the capacitors 2b, 2c, 2d that are next to be measured are turned to the closed state, thereby making it possible for the microprocessor unit 10 to carry out the voltage measurement. The timing of the reading of the voltage at the voltage measuring terminal of the microprocessor unit 10 is set to a timing slightly delayed after the switching devices for measuring operation 8a 8b, 8c are turned to the closed state.

The switching devices for ground connection 7a, 7b, 7c are operated to be switched by the output pulse signals from the control signal output terminals "GC1" to "GC3" of the microprocessor unit 10, and the timings of the switching operation are also indicated by "GC1" to "GC3" in FIG. 2.

Further, the switching devices for measuring operation 8a 8b, 8c are operated to be switched by the output pulse signals from the control signal output terminals "MC1" to "MC3" of the microprocessor unit 10, and the timings of the switching operation are also indicated by "MC1" to "MC3" in FIG. 2.

For example, upon completion of the voltage detection for the capacitor 2a (see "A/D1" in FIG. 2), the switching device for ground connection 7a is turned to the closed state by the signal "GC1", and thereafter, the switching device for measuring operation 8a is turned to the closed state by the signal "MC1".

As shown in FIG. 2, the operation is the same for the capacitors 2b, 2c, 2d on the higher potential side that will be described later.

In this manner, once the voltage of each of the electric cells 1a, 1b, 1c, 1d is read, the microprocessor unit 10 that functions as the disconnection detecting unit CC receives and stores a measurement result and record in Step #3 in FIG. 3.

Subsequently, as shown by "SC1" and "SC2" in FIG. 2, the switching devices for auxiliary current channel 4b, 4d provided for the even-numbered (second and fourth) auxiliary current channels 6b, 6d from the lower potential side in the potential order are turned to the closed state (ON state) for a time period that has been previously set, and the switching devices for auxiliary current channel 4a, 4c provided for the odd-numbered (first and third) auxiliary current channels 6a, 6c from the lower potential side in the potential order are maintained to the open state (OFF state) (Step #4). For explanation's sake, the setting state of the switching devices for auxiliary current channel 4a, 4b, 4c, 4d is referred to as a second switching setting state.

In the second switching setting state, the switching operation is inverted from the first switching setting state, in order to prevent the adjacent switching devices for auxiliary current channel 4a, 4b, 4c, 4d in the potential order from being turned to the closed state at the same time.

Next, the same subroutine as in the measurement process in Step #2 is called to carry out the measurement operation that is completely the same as the setting operation for voltage measurement as described above as shown by a "second measurement cycle" in FIG. 2 (Step #5), and read data of the voltage for each of the electric cells 1a, 1b, 1c, 1d is received (Step #6).

When data pieces from two measurements of Step #3 and Step #6 are obtained, whether or not the wiring disconnection has occurred is determined (Step #7).

Figure 4A:
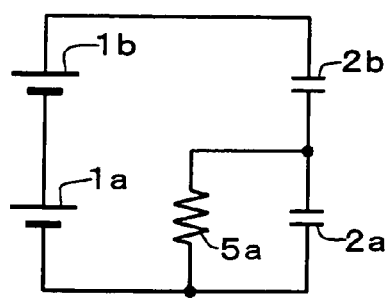
FIG. 4(a) and FIG. 4(b) are circuit diagrams for illustrating operations according to the embodiment of the present invention.

For example, provided that the wiring disconnection occurs at a position indicated by a symbol A in FIG. 1, the capacitors 2a, 2b are charged from the electric cells 1a, 1b by a circuit shown in FIG. 4(a) in the first measurement cycle.

In the circuit shown in FIG. 4(a), the capacitor 2a is connected in parallel with a resistance 5a, and ultimately, the capacitor 2a is not charged and the capacitor 2b is charged with the voltage of the electric cells 1a, 1b.

Therefore, in the first measurement cycle, the voltage of the capacitor 2a detected as the voltage of the electric cell 1a becomes an extremely low voltage, which almost 0 V, and the voltage of the capacitor 2b detected as the voltage of the electric cell 1b becomes a voltage higher than a voltage for a normal electric cell (a voltage nearly twice as large).

Next, in the second measurement cycle, the capacitors 2a, 2b are charged from the electric cells 1a, 1b by a circuit shown in FIG. 4(b).

In the circuit shown in FIG. 4(b), the capacitor 2b is connected in parallel with a resistance 5b, and ultimately, the capacitor 2b is not charged and the capacitor 2a is charged with the voltage of the electric cells 1a, 1b.

Therefore, in the second measurement cycle, the voltage of the capacitor 2a detected as the voltage of the electric cell 1a becomes a voltage higher than a voltage for a normal electric cell (a voltage nearly twice as large), and the voltage of the capacitor 2b detected as the voltage of the electric cell 1b becomes an extremely low voltage, which almost 0 V.

In Step #7 in FIG. 3, a difference between the detection voltages when the respective switching devices for auxiliary current channel 4a, 4b, 4c, 4d are turned to the open state and to the closed state is obtained for the detection voltage for each of the electric cells 1a, 1b, 1c, 1d in the first measurement cycle and the second measurement cycle (practically, the detection voltage of each of the corresponding capacitors 2a, 2b, 2c, 2d), and it is determined that the wiring disconnection has occurred when the differential voltage is greater than a set value (for example, 0.7 V).

Figure 4:
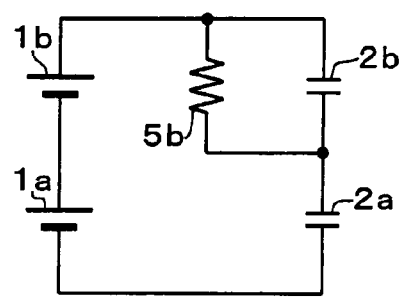
Figure 5:
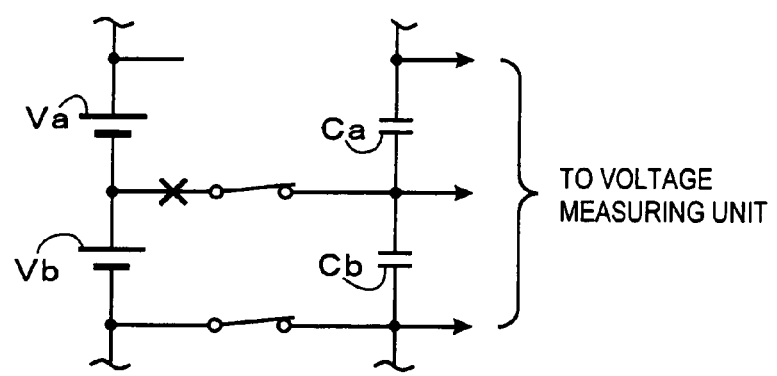
FIG. 5 is a diagram for illustrating an operation when wiring disconnection occurs.
Figure 6A:
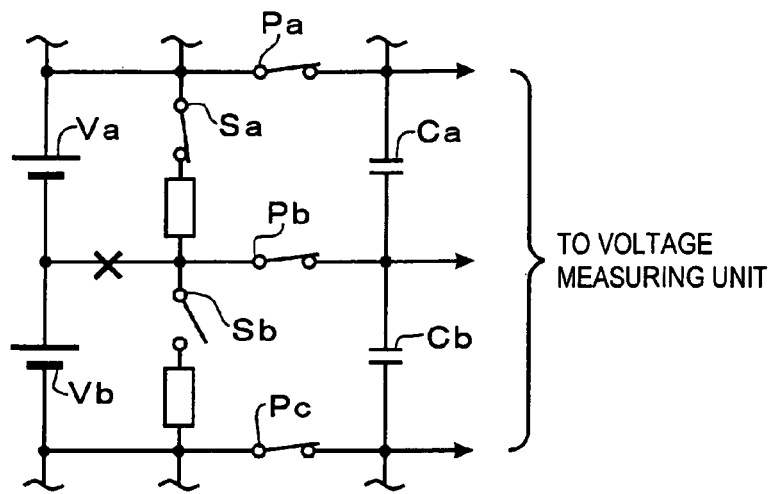
FIG. 6(a) and FIG. 6(b) are diagrams illustrating detection of the wiring disconnection.
Figure 6B:
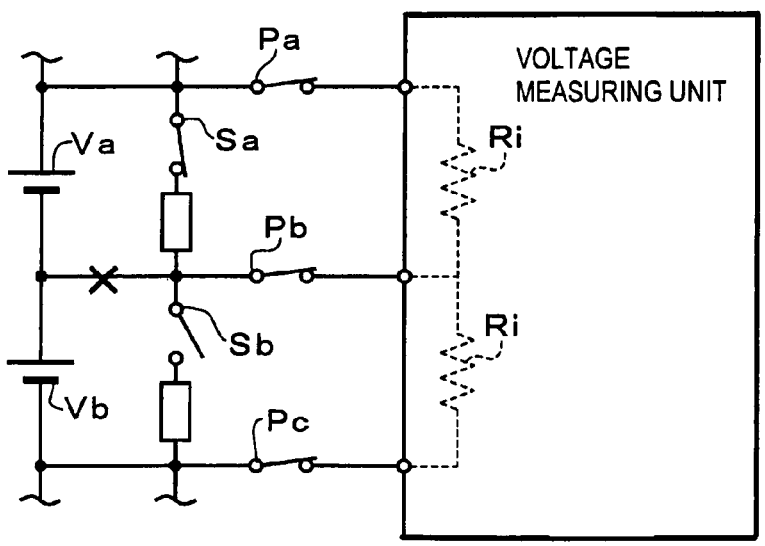

In the example shown in FIG. 4, it is determined that the wiring disconnection has occurred based on the voltage measurement result for the electric cell 1a and the electric cell 1b, and the position at which the wiring disconnection has occurred can be specified.

Specifically, it is possible to specify that the wiring disconnection has occurred in the wiring on the higher potential side of the electric cell 1a (i.e., the lower potential side of the electric cell 1b).

Incidentally, instead of obtaining the difference between the detection voltages when the corresponding switching devices for auxiliary current channel 4a, 4b, 4c, 4d are in the open state and in the closed state, respectively, it is possible to determine that the wiring disconnection has occurred based only on values of the detection voltages of the corresponding switching devices for auxiliary current channel 4a, 4b, 4c, 4d in the closed state being lower than the set value.

When it is determined that the wiring disconnection has occurred (Step #8), the determination is notified to an upper management device that is not shown in the drawing (Step #9).

While the case in which the switching devices 4a, 4c of the odd-numbered auxiliary current channels 6a, 6c in the potential order are turned to the closed state in the first measurement cycle, and the switching devices 4b, 4d of the even-numbered auxiliary current channels 6b, 6d in the potential order are turned to the closed state in the second measurement cycle is described above, it is possible to carry out the switching operation of the switching devices by alternating the odd-numbered ones and the even-numbered ones.

ANOTHER EMBODIMENT

In the embodiment, the case in which the auxiliary current channels 6a, 6b, 6c, 6d also serve as the circuit portions for balancing the voltages of the electric cells 1a, 1b, 1c, 1d that constitute the assembled battery 1, but these components can be provided separately.

As described above, according to the above embodiment, when the wiring disconnection occurs, the measured voltage varies greatly depending on whether the voltage measurement is carried out with the switching device for auxiliary current channel in the closed state or in the open state, and therefore, it is possible to adequately detect the wiring disconnection when the disconnection occurs in the wiring for detecting the voltage of each electric cell.

Further, according to the above embodiment, the occurrence of the wiring disconnection appears as a large change in the detection voltages, and therefore, by detecting the voltage of an electric cell by means of a capacitor, it is possible to adequately detect the wiring disconnection when the disconnection occurs in the wiring for detecting the voltage of each electric cell, while allowing the voltage detection with high accuracy.

Further, according to the above embodiment, the difference between the detection voltages when the switching device for auxiliary current channel is turned to the open state and to the closed state is large, and it is possible to determine the presence of the wiring disconnection with high accuracy by determining the presence of the wiring disconnection based on the difference.

Further, according to the above embodiment, when the wiring disconnection occurs, the measured voltage varies greatly depending on whether the voltage measurement is carried out with the switching device for auxiliary current channel in the closed state or in the open state, thereby detecting the presence of the wiring disconnection, and therefore, it is possible to adequately detect the wiring disconnection when the disconnection occurs in the wiring for detecting the voltage of each electric cell.

Further, according to the above embodiment, the occurrence of the wiring disconnection appears as a large change in the detection voltages, and therefore, by detecting the voltage of the electric cell by means of the capacitor, it is possible to adequately detect the wiring disconnection when the disconnection occurs in the wiring for detecting the voltage of each electric cell, while allowing the voltage detection with high accuracy.

Further, according to the above embodiment, the difference between the detection voltages when the switching device for auxiliary current channel is turned to the open state and to the closed state is large, and it is possible to determine the presence of the wiring disconnection with high accuracy by determining the presence of the wiring disconnection based on the difference.

Further, according to the above embodiment, in the assembled battery system, it is possible to adequately detect the wiring disconnection when the disconnection occurs in the wiring for detecting the voltage of each electric cell.

Further, according to the above embodiment, in the assembled battery system that measures the voltage of the electric cell by means of the capacitor, it is possible to adequately detect the wiring disconnection when the disconnection occurs in the wiring for detecting the voltage of each electric cell, while allowing the voltage detection with high accuracy.

Further, according to the above embodiment, in the assembled battery system that measures the voltage of the electric cell by means of the capacitor, the difference between the detection voltages when the switching device for auxiliary current channel is turned to the open state and to the closed state is large, and it is possible to determine the presence of the wiring disconnection with high accuracy by determining the presence of the wiring disconnection based on the difference.

What is claimed is:

1. An assembled battery monitoring device for an assembled battery in which a plurality of electric cells are connected in series, the device comprising: a voltage measuring unit that detects a voltage of each electric cell by carrying out a setting operation for voltage measurement through wiring pulled from positive terminals of each electric cell and a negative terminal of an electric cell on a lowest potential side; and a disconnection detecting unit that detects presence of disconnection in the wiring based on a detection voltage obtained by the setting operation for voltage measurement, wherein the electric cells are connected respectively in parallel to auxiliary current channels each having a setting resistance value for balancing voltages of the plurality of electric cells, each of the auxiliary current channels is provided with a switching device for auxiliary current channel that turns on and off electricity through the corresponding auxiliary current channel, the disconnection detecting unit is configured to carry out a switching operation of the switching devices for auxiliary current channel in conjunction with the setting operation for voltage management so as to prevent the switching devices that are adjacent in a potential order from being turned to the closed state at the same time, and to detect the presence of the disconnection in the wiring based on at least detection voltages when the switching devices for auxiliary current channel are turned to the closed state out of detection voltages obtained by the setting operation for voltage measurement, and the switching operation of the switching devices for auxiliary current channel the disconnection detecting unit divides the switching devices into two groups wherein neither one of said groups includes two of the switching devices that are adjacent in a potential order, and controls the state of the switching devices by group such that when the switching state of one said group of switches is ON the switching state of the other said group of switches is OFF.

2. The assembled battery monitoring device according to claim 1, wherein the electric cells are connected respectively in parallel to capacitors in the wiring from the electric cells to the voltage measuring unit, a switching device for positive terminal wiring that turns on and off electricity of the wiring is provided between the wiring between a positive terminal side of each of the electric cells and the capacitor corresponding to the electric cell, the voltage measuring unit is configured to measure a voltage of each of the capacitors as the setting operation for voltage measurement by, after turning the switching device for positive terminal wiring in an open state to a closed state and charging each capacitor, turning the switching device for positive terminal wiring to the open state, and the disconnection detecting unit is configured to cause the voltage measuring unit to carry out the setting operation for voltage measurement in a first switching setting state in which one of even-numbered and odd-numbered ones of the switching devices for auxiliary current channel in the potential order are turned to the closed state at the same time and the other ones to the open state at the same time, subsequently cause the voltage measuring unit to carry out the setting operation for voltage measurement in a second switching setting state in which each of the switching devices for auxiliary current channel is operated to be switched to a state opposite from the state in the first switching setting state, and to detect the presence of the wiring disconnection based on a detection voltage in the first switching setting state and a detection voltage in the second switching setting state.

3. The assembled battery monitoring device according to claim 2, wherein the disconnection detecting unit is configured to obtain, for each electric cell, a difference between the detection voltage in the first switching setting state and the detection voltage in the second switching setting state, and detect the presence of the wiring disconnection based on the difference.

4. A method of detecting disconnection in wiring for an assembled battery in which a plurality of electric cells are connected in series, the method including: detecting a voltage of each electric cell by carrying out a setting operation for voltage measurement through wiring pulled from positive terminals of each electric cell and a negative terminal of an electric cell on a lowest potential side; and detecting disconnection in the wiring based on a detection voltage obtained by the setting operation for voltage measurement, wherein the electric cells are connected respectively in parallel to auxiliary current channels each having a setting resistance value for balancing voltages of the plurality of electric cells, each of the auxiliary current channels is provided with a switching device for auxiliary current channel that turns on and off electricity through the corresponding auxiliary current channel, the method comprises: carrying out a switching operation of the switching devices for auxiliary current channel so as to prevent the switching devices that are adjacent in a potential order from being turned to the closed state at the same time, and detecting the presence of the disconnection in the wiring based on at least a detection voltage when the switching devices for auxiliary current channel are turned to the closed state out of detection voltages obtained by the setting operation for voltage measurement, and during the switching operation of the switching devices for auxiliary current channel the disconnection detecting step involves dividing the switching devices into two groups wherein neither one of said groups includes two of the switching devices that are adjacent in a potential order, and controlling the state of the switching devices by group such that when the switching state of one said group of switches is ON the switching state of the other said group of switches is OFF.

5. The method of detecting disconnection in wiring for an assembled battery according to claim 4, wherein the electric cells are connected respectively in parallel to capacitors in the wiring pulled from the electric cells, a switching device for positive terminal wiring that turns on and off electricity of the wiring is provided between the wiring between a positive terminal side of each of the electric cells and the capacitor corresponding to the electric cell, and the method comprises: measuring a voltage of each of the capacitors as the setting operation for voltage measurement by, after turning the switching device for positive terminal wiring in an open state to a closed state and charging each capacitor, turning the switching device for positive terminal wiring to the open state; and carrying out the setting operation for voltage measurement with the voltage measuring unit in which one of even-numbered and odd-numbered ones of the switching devices for auxiliary current channel in the potential order are turned to the closed state at the same time and the other ones to the open state at the same time, subsequently carrying out the setting operation for voltage measurement with the voltage measuring unit in a second switching setting state in which each of the switching devices for auxiliary current channel is operated to be switched to a state opposite from the state in the first switching setting state, and detecting the presence of the wiring disconnection based on a detection voltage in the first switching setting state and a detection voltage in the second switching setting state.

6. The method of detecting disconnection in wiring for an assembled battery according to claim 5, the method comprising:

obtaining, for each electric cell, a difference between the detection voltage in the first switching setting state and the detection voltage in the second switching setting state, and detect the presence of the wiring disconnection based on the difference.

7. An assembled battery system comprising: an assembled battery in which a plurality of electric cells are connected in series; wiring pulled from positive terminals of each electric cell and a negative terminal of an electric cell on a lowest potential side; and the assembled battery monitoring device according to claim 1 that detects presence of disconnection in the wiring.

8. An assembled battery system comprising: an assembled battery in which a plurality of electric cells are connected in series; wiring pulled from positive terminals of each electric cell and a negative terminal of an electric cell on a lowest potential side; and the assembled battery monitoring device according to claim 2 that detects presence of disconnection in the wiring.

9. An assembled battery system comprising: an assembled battery in which a plurality of electric cells are connected in series; wiring pulled from positive terminals of each electric cell and a negative terminal of an electric cell on a lowest potential side; and the assembled battery monitoring device according to claim 3 that detects presence of disconnection in the wiring.

10. The assembled battery monitoring device according to claim 1, wherein the voltage measuring unit separately detects a voltage of each electric cell by carrying out the setting operation for voltage management.

11. The assembled battery monitoring device according to claim 1, wherein the voltage measuring unit that detects the voltage of each electric cell by carrying out the setting operation for voltage measurement through wiring pulled from each of the positive terminals of each electric cell and the negative terminal of the electric cell on the lowest potential side.

12. The method of detecting disconnection in wiring for an assembled battery according to claim 4, wherein during the voltage detecting step a voltage of each electric cell is separately detected by carrying out the setting operation for voltage management.

13. The method of detecting disconnection in wiring for an assembled battery according to claim 4, wherein in the voltage detecting step the voltage of each electric cell is detected by carrying out the setting operation for voltage measurement through wiring pulled from each of the positive terminals of each electric cell and the negative terminal of the electric cell on the lowest potential side.

\* \* \* \* \*